United States Patent
Patterson et al.

(10) Patent No.: US 10,649,026 B2
(45) Date of Patent: May 12, 2020

(54) APPARATUS FOR AND METHOD OF NET TRACE PRIOR LEVEL SUBTRACTION

(71) Applicant: GLOBALFOUNDRIES INC., Grand Cayman (KY)

(72) Inventors: Oliver D. Patterson, Poughkeepsie, NY (US); Peter Lin, Ballston Lake, NY (US); Weihong Gao, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 429 days.

(21) Appl. No.: 15/474,104

(22) Filed: Mar. 30, 2017

(65) Prior Publication Data

US 2018/0284184 A1 Oct. 4, 2018

(51) Int. Cl.
| | | |
|---|---|---|
| G01R 31/28 | (2006.01) | |
| G01R 31/307 | (2006.01) | |
| H01L 21/66 | (2006.01) | |

(52) U.S. Cl.
CPC ....... G01R 31/2853 (2013.01); G01R 31/307 (2013.01); H01L 22/20 (2013.01); H01L 22/12 (2013.01); H01L 22/14 (2013.01)

(58) Field of Classification Search
CPC ... G01R 31/2853; G01R 31/307; H01L 22/20; H01L 22/12; H01L 22/14; G06T 7/0004; G06T 7/0024; G01N 21/8851
USPC ......... 324/760.01–763.01, 600, 500, 757.04, 324/663, 671, 759.03; 700/121, 215, 224, 700/229; 382/145; 438/112, 15, 25
See application file for complete search history.

(56) References Cited

U.S. PATENT DOCUMENTS

| 6,642,726 B2 | 11/2003 | Weiner et al. |
| 7,679,083 B2 | 3/2010 | Sun et al. |
| 2005/0085032 A1* | 4/2005 | Aghababazadeh ......... G01R 31/2831 438/232 |
| 2010/0279436 A1* | 11/2010 | Fu .......... H01L 22/12 438/14 |

(Continued)

FOREIGN PATENT DOCUMENTS

| CN | 103500720 B | 10/2016 |
| TW | I406347 | 8/2013 |

OTHER PUBLICATIONS

Taiwanese Application No. 106134738, Examination Report dated Nov. 2, 2018 and Search Report dated Oct. 18, 2018, pp. 1-6.

(Continued)

*Primary Examiner* — Melissa J Koval
*Assistant Examiner* — Trung Nguyen
(74) *Attorney, Agent, or Firm* — Gibb & Riley, LLC; Michael J. LeStrange, Esq.

(57) ABSTRACT

A method in which connectivity tests of integrated circuit structures in a die are performed. The connectivity tests are performed at a first level of the die. Potential defect locations are identified in the die indicating via locations susceptible to systematic failure due to via opens or via shorts. The potential defect locations are translated to via locations for a second level of the die. The second level is below the first level. After translating the hot spot, the second level is inspected for defects. The via locations on the first level are inspected for defects. All defects for the second level are translated to the via locations for the first level. A net trace of defects is created using prior level subtraction of the translated defects for the second level and the defects for the first level.

20 Claims, 9 Drawing Sheets

(56) References Cited

U.S. PATENT DOCUMENTS

2016/0306009 A1    10/2016   Gao et al.

OTHER PUBLICATIONS

Taiwanese Application No. 106134738, Notice of Allowance dated Jun. 12, 2019, pp. 1-3.
KLA Tencor Corporation, "Klarity Defect" Dec. 2004, pp. 1-2.
Weihong Gao et al.,"Net tracing and classification analysis on E-beam die-to-database inspection", Proc. SPIE 9778, Metrology, Inspection, and Process Control for Microlithography XXX, 97783Q (Mar. 25, 2016).
R. L. Guldi et al., "Characterization of Copper Voids in Dual Damascene Processes," Proceedings of ASMC, p. 351-355, 2002.
R. F. Hafer et al., "Full-Wafer Voltage Contrast Inspection for Detection of BEOL Defects", IEEE Trans on Semiconductor Manufacturing, Nov. 2015.
O. D. Patterson et al., "The Merits of High Landing Energy for E-beam Inspection", Proceedings of ASMC, May 2015.
B. Donovan et al., "Early Detection of Electrical Defects in Deep Trench Capacitors using Voltage Contrast Inspection" Proceedings of ASMC, May 2013, pp. 301-306.
O.D. Patterson, X J. Zhou, R. S. Takalkar, K. V. Hawkins, E. H. Beckmann, B. W. Messenger, R. Hahn, "Methodology for Trench Capacitor Etch Optimization using Voltage Contrast Inspection and Special Processing", Proceedings of ASMC, Jul. 2010, pp. 109-114.
K. J. Zhou et al.,"Characterization of Contact Module Failure Mechanisms for SOI Technology using E-beam Inspection and In-line Tem", Proceedings of ASMC, Jul. 2010, pp. 270-276.
O.D. Patterson et al., Voltage Contrast Inspection Methodology for In-line Detection of Missing Spacer and Other Nonvisual Defects, IEEE Trans on Semiconductor Manufacturing, Aug. 2008, vol. 21, Iss. 3, pp. 322-328.
O. D. Patterson et al., "In-Line Process Window Monitoring using Voltage Contrast Inspection", Proceedings of ASMC, May 2008, pp. 19-24.
O. D. Patterson et al., "Detection and Verification of Silicide Pipe Defects on SOI Technology using Voltage Contrast Inspection", Proceedings of ISTFA 2007, Nov. 2007, pp. 270-274.
O.D. Patterson et al., Scan Direction and Voltage Contrast Inspection Signal Intensity, ISSM 2007, Oct. 2007.
O.D. Patterson et al., "Detection of Resistive Shorts and Opens using Voltage Contrast Inspection", Proceedings of ASMC 2006, pp. 327-333.
O.D. Patterson et al., "In-Line Voltage Contrast Inspection of ungrounded Chain Test Structures for Timely and Detailed Characterization of Contact and via Yield loss", Proceedings of ISTFA, pp. 401-406, Nov. 2005.
O.D. Patterson et al., "Rapid Reduction of Poly-Silicon Electrical D0 using uLoop Test Stuctures", Proceedings of ASMC, pp. 266-272, Mar 2003.
O.D. Patterson et al.,"Real Time Fault Site Isolation of Front-end Defects in ULSI-ESRAM Utilizing In-Line Passive Voltage Contrast Analysis", Proceedings of ISTFA, pp. 591-599, Nov. 2002.
A. V. S. Satya, "Microelectronic Test Structures for Rapid Automated Contactless Inline Defect Inspection", IEEE Trans. Semi. Manuf., vol. 10, No. 3, 384-9 (1997).
V. Liang et al., "Passive Voltage Contrast Technique for Rapid In-line Characterization and Failure Isolation During Development of Deep-Submicron ASIC CMOS Technology," Proceedings of ISTFA, pp. 221-225, 1998.
K. Weiner et al., "Defect Management for 300mm and 130mm Technologies Part 3: Another Day, Another Yield Learning Cycle," Yield Management Solutions, vol. 4, Iss. 1, 15-27 (Winter 2002).
M. Lei et al., Detection and Classification of Gate to SID Shorts using Charge Dynamics, Proceedings of ASMC 2016.
J. L. Baltzinger et al., "E-beam Inspection of Dislocations: Product Monitoring and Process Change Validation", Proceedings of ASMC, 2004, pp. 359-366.
A. Nishikawa et al., "An Application of Passive Voltage Contrast (PVC) to Failure Analysis of CMOS LSI Using Secondary Electron Collection", Proceedings of ISTFA, 1999, pp. 239-243.
O. Moreau et al., "Early detection of crystal defects in the device process flow by electron beam inspection", Proceedings of ASMC, 2006, pp. 334-339.
Shuen-chen Lei et al., "Contact leakage and open monitoring with an advanced e-beam inspection system", Proc. SPIE 6518, Metrology, Inspection, and Process Control for Microlithography XXI, 651841 (Apr. 5, 2007).
R. L. Guldi et al., "Characterization of Copper Voids in Dual Damascene Processes," Proceedings of ASMC, p. 351-355, 2002 (Abstract provided).
O.D. Patterson et al., "Methodology for Trench Capacitor Etch Optimization using Voltage Contrast Inspection and Special Processing", Proceedings of ASMC, Jul. 2010, pp. 109-114.
X. J. Zhou et al.,"Characterization of Contact Module Failure Mechanisms for SOI Technology using E-beam Inspection and In-line TEM", Proceedings of ASMC, Jul. 2010, pp. 270-276.
A. V. S. Satya, "Microelectronic Test Structures for Rapid Automated Contactless Inline Defect Inspection", IEEE Trans. Semi. Manuf., vol. 10, No. 3, 384-9 (1997) (Abstract provided).
V. Liang et al., "Passive Voltage Contrast Technique for Rapid In-line Characterization and Failure Isolation During Development of Deep-Submicron ASIC CMOS Technology," Proceedings of ISTFA, pp. 221-225, 1998 (Abstract provided).
M. Lei et al., Detection and Classification of Gate to S/D Shorts using Charge Dynamics, Proceedings of ASMC 2016.
J. L. Baltzinger et al., "E-beam Inspection of Dislocations: Product Monitoring and Process Change Validation", Proceedings of ASMC, 2004, pp. 359-366(Abstract provided).
Shuen-chen Lei et al., "Contact leakage and open monitoring with an advanced e-beam inspection system", Proc. SPIE 6518, Metrology, Inspection, and Process Control for Microlithography XXI, 651841 (Apr. 5, 2007) (Abstract provided).

\* cited by examiner

APPARATUS FOR AND METHOD OF NET TRACE PRIOR LEVEL SUBTRACTION

BACKGROUND

The present disclosure relates to manufacture of semiconductor devices such as integrated circuits and, more particularly, to methods of inspecting integrated circuits and detecting defects.

Due to continuing technological innovations in the field of semiconductor fabrication, integrated circuit chips are being developed with larger scale of integration and higher device density, as well as lower power consumption and higher operating speeds. In general, integrated circuits are manufactured using FEOL (front-end-of-line) processing technologies to form discrete semiconductor devices within the surface of a silicon wafer followed by BEOL (back-end-of-line) processing techniques to form a multi-level metallurgical interconnection network over the semiconductor devices to provide the wiring and contacts between the semiconductor devices to create the desired circuits. When semiconductor integrated circuits are designed based on sub-micron dimensions and beyond, it is very important that tight dimensional control is achieved since slight variations in processing conditions can generate significant dimensional deviations of the patterned features or other electrical defects. In this regard, semiconductor wafers are typically inspected at various stages/levels of development to ensure quality control and detect and eliminate critical, yield-limiting defects.

Design systematic defects pose critical yield bottlenecks in the semiconductor design process, throughout the yield ramping for a technology. Via opens and shorts are common sources of yield loss. Fortunately opens and shorts can be detected. One of the most effective ways to detect systematic via failure is by electron beam (e-beam) voltage contrast (VC) inspection, which compares the voltage contrast of vias in silicon to the design. Electron beam inspection is a common technique that is employed using an SEM (scanning electron microscope) to detect electrical and physical defects on a semiconductor wafer through VC inspection of a secondary electron image. In general, electron beam VC inspection involves scanning a target region of the wafer with a focused electron beam emitted by an SEM. The electron beam irradiates the target region causing the emission of secondary electrons and a secondary electron detector measures the intensity of the secondary electron emission along the scan path of the electron beam. As a region is scanned, electrons from the electron beam induce surface voltages that vary over the scanned region due to differential charge accumulation of the irradiated features. VC inspection operates on the principle that differences in the induced surface voltages over a scanned region will cause differences in secondary electron emission intensities. For example, for conductive features, electrical defects can be detected as voltage contrast defects due to charging differences between defective structures and non-defective structures.

Such electron beam inspection can effectively detect an open via or a via short using VC in certain logic patterns. The problem is that when opens or shorts are detected, it is not clear if the open or short is at the current via level or at a prior level of the structure.

SUMMARY

For bulk technology, when inspecting with in-line e-beam inspection for via opens (or via shorts), it is not clear whether the via at the current level is open (or shorted) or if a prior level via is open (or shorted). The methodology described herein enables nuisance defects (opens or shorts from a prior level) to be filtered out so that a pure metric for defects at the current level may be provided.

During design of an integrated circuit die, locations are identified in the wafer that may be susceptible to systematic failure due to via opens or via shorts. During manufacture of the die, connectivity tests of the integrated circuit structures in the die are performed at a level of the die by VC inspection. The VC inspection may be performed after formation of the integrated circuit structures and deposition of the first metal layer M1. (As is known in the art, the various levels of the die are numbered in order of deposition. For example, the first metal layer to be deposited is M1; the second metal layer to be deposited is M2; etc. The vias connecting metal layers are similarly numbered. For example, between M1 and M2 is V1, between M2 and M3 is V2, etc.) The VC inspection identifies potential defect locations. The potential defect locations are translated to via locations for a second level of the die. After translating the potential defect location, the second level is inspected for defects. The via locations on the first level, which comes later in the process sequence, are then inspected for defects. All defects for the second level are translated to the via locations for the first level. A pure metric for defects at the current level is created using prior level subtraction of the translated defects for the second level and the defects for the first level.

According to an exemplary method of detecting defects in levels of a die in a wafer for an integrated circuit structure, via locations susceptible to systematic failure due to via opens or via shorts are identified in a selected level of a die. Connectivity tests of these locations are performed at the selected level of the die using design analysis software, filtering all via locations that will not show a VC signal if a defect exists. The potential defect locations (sometimes referred to herein as hot spots) are translated to the via locations for a lower level below the selected level. After translating the potential defect locations, an inspection is performed at the lower level. The inspection identifies via opens or via shorts defects. The wafer is then processed to the selected level. That is, conventional processing of the wafer can be performed, such as depositing a dielectric layer, patterning and etching the metal, patterning and etching the via level, filling the via with metal, and CMP of the wafer. An inspection is then performed on the via locations on the selected level. All defects for the lower level (i.e., below the selected level) are translated to the via locations for the selected level above using a net trace procedure. The defects at the level below the selected level are subtracted from the defects at the selected level.

According to another exemplary method herein, connectivity tests of integrated circuit structures are performed at a selected level of a die. Potential defect locations are identified in the die centering on via locations susceptible to systematic failure due to via opens or via shorts. The potential defect locations are translated to via locations for a second level of the die that is on the same net as the vias at the selected level. The second level is below the selected level. After translating the potential defect locations, an electron beam voltage contrast comparison inspection for defects is performed on each via location for the selected level of the die and the second level of the die. All defects for the second level are translated to the via locations for the selected level. The defects at the second level are subtracted from the defects at the selected level.

According to another exemplary method, potential defect locations are identified in a die susceptible to systematic failure due to via opens or via shorts. Connectivity tests are performed in the die by applying voltages to a selected level of the die. Error locations are identified in a level below the selected level by measuring charge of areas of the selected level to locate areas of the level below the selected level that charge relatively less than surrounding areas of the selected level during the connectivity tests. The error locations are translated to the selected level of the die by identifying areas in the selected level that are electrically connected to the error locations using net tracing tools. After translating the error locations, via inspection locations on the selected level are generated by subtracting the error locations that translate to known defects in a level below the selected level. Defective vias in the selected level are identified by inspecting only the selected level via inspection locations for defects.

BRIEF DESCRIPTION OF THE DRAWINGS

The foregoing and other exemplary purposes, aspects and advantages will be better understood from the following detailed description of exemplary embodiments herein with reference to the drawings, which are not necessarily drawn to scale and in which.

DETAILED DESCRIPTION

According to methods herein, current level defects are separated from prior level defects during die inspection. It is important to note that throughput is very limited for e-beam voltage contrast inspection. Current tools can only inspect tens of thousands of hot spots per hour on a wafer, whereas the number of vias on a wafer is in the billions. Therefore knowing where to inspect enables a successful inspection. A random inspection at the prior levels would not be useful for prior level subtraction and therefore cannot be utilized. The process described herein determines where to inspect at the inspection level by identifying via locations that are susceptible to systematic failure due to via open or via short and performing a connectivity check to limit the list of locations.

Connectivity testing refers to measuring the state of electrical connections in the die in order to verify that the circuit devices are connected properly to others. This type of testing can uncover bad chip bonding, bad chip sockets, bad printed-circuit boards, bad printed-circuit board sockets, bad wiring, etc.

Once data identifying the location of target vias is obtained, these via locations are translated to corresponding via locations on the same net as the previous inspection level. (Prior level subtraction of untranslated data from prior levels would have limited benefit, as prior level defects outside the max distance (a metric defined in the prior-level subtraction process) between an inspection level via defect and a prior level via defect would not be subtracted.)

In view of the foregoing, disclosed herein are methods of detecting defects in levels of a die for an integrated circuit structure. According to an exemplary method, via locations susceptible to systematic failure due to via opens or via shorts are identified in a selected level of a die. Connectivity tests of integrated circuit structures in the die are performed at the selected level of the die to filter out all via locations that will not show a voltage contrast signal if a defect exists. The remaining via locations are termed potential defect locations. (Potential defect locations are sometimes called hot spots to refer to the small region inspected around each via.) The potential defect locations are translated to the via locations for a level below the selected level (sometimes referred to herein as a prior level). After translating the hot spot, an inspection is performed at the level below the selected level. The inspection identifies via opens or via shorts defects. An inspection is performed on the via locations on the selected level. All defects for the level below the selected level are translated to the via locations for the selected level above. A net trace of defects is created using prior level subtraction of the translated defects for the level below the selected level and the defects for the selected level.

Figure 1:
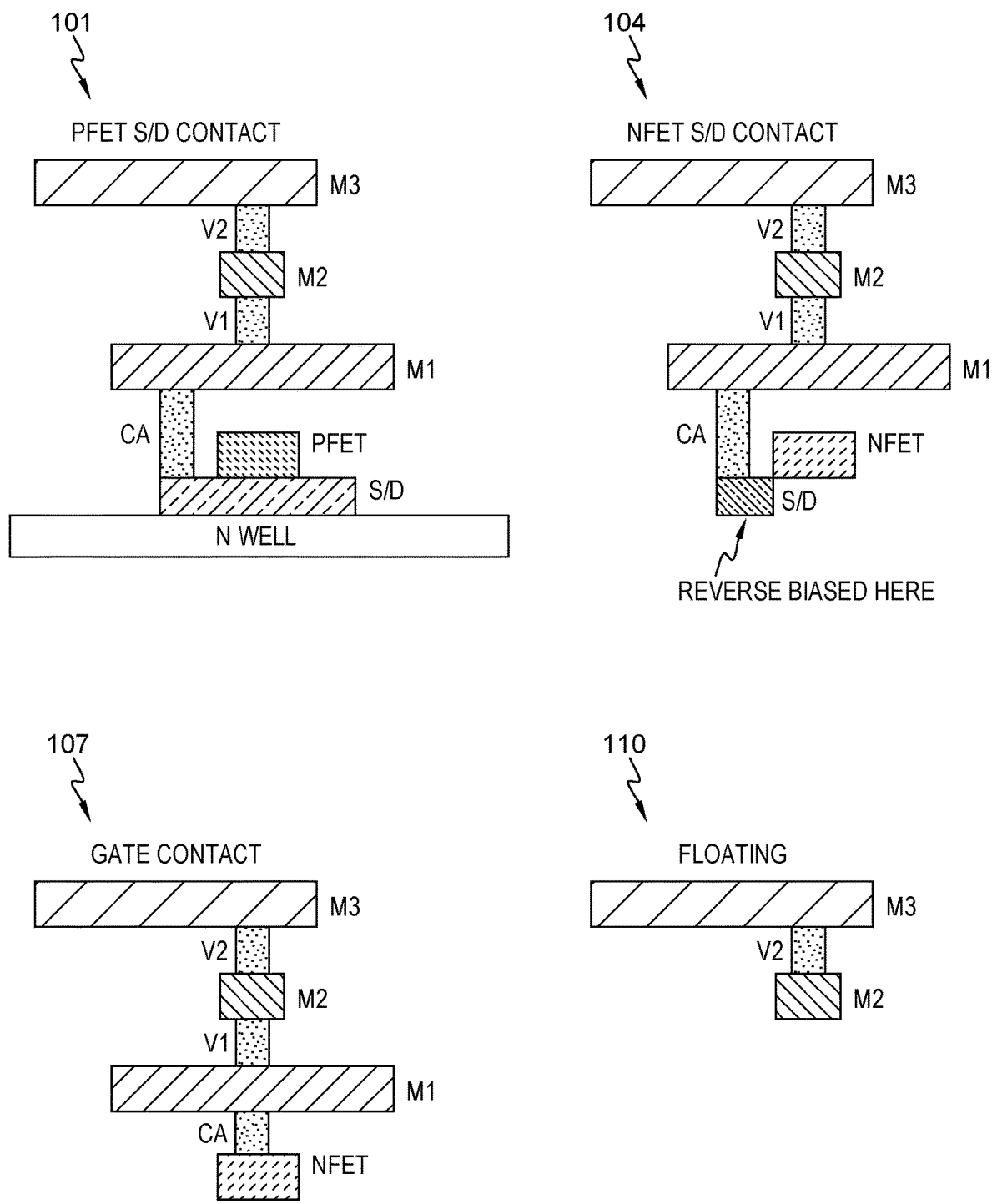
FIG. 1 illustrates four categories of nodes in different levels of a substrate according to structures and methods herein.

In die manufacturing, every via or metal shape at a level of interest (e.g. the via 2 or metal 3 layer) will have a different amount of virtual grounding. Virtual grounding, which means the resistance to charging during voltage contrast inspection, is a function of the capacitance and leakage to the wafer substrate of the electrical node to which the via or metal runner is connected. In situations where the leakage is minimal, nodes will charge up according to Ohm's laws for a capacitor: $I=C*dV/dt$ or $dV=(I*dt)/C$. Referring to FIG. 1, for bulk technology (under standard positive mode conditions), nodes that connect to PFET source or drain (S/D) contacts, indicated as 101, generally have the most virtual grounding since the PFET S/D is forward biased to the Nwell, which is generally very large. Nodes that connect to NFET S/D contacts, indicated as 104, or gate contacts, indicated as 107, will have a significantly lower amount of virtual grounding because the NFET S/D contact to P doped substrate junction is reverse biased and the gates are isolated from the substrate by the gate oxide. Nodes that don't reach the transistor level are referred to as floating, indicated as 110, and generally have even less virtual grounding. There is further variation in virtual grounding inside these four categories due to the total length of wiring and other factors.

Figure 2:
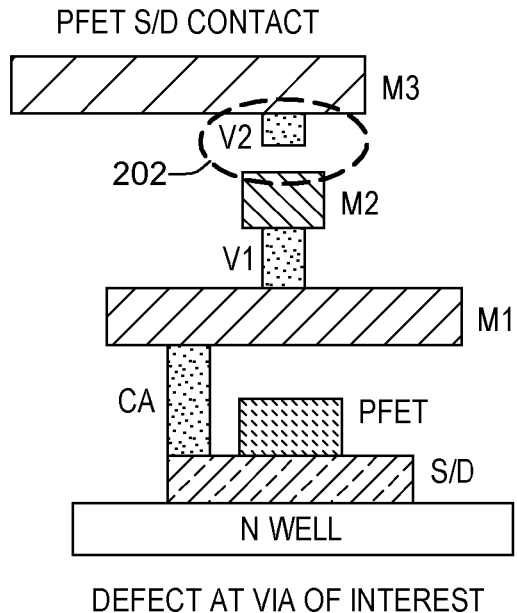
FIG. 2 illustrates defects at different levels of a substrate according to structures and methods herein.
Figure 2:
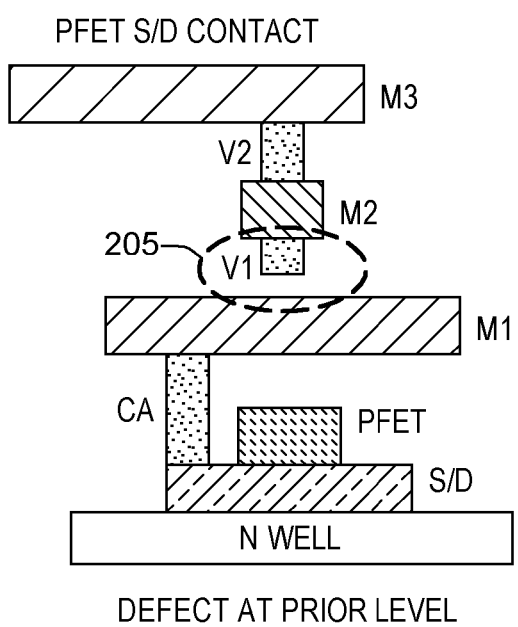
Figure 2:
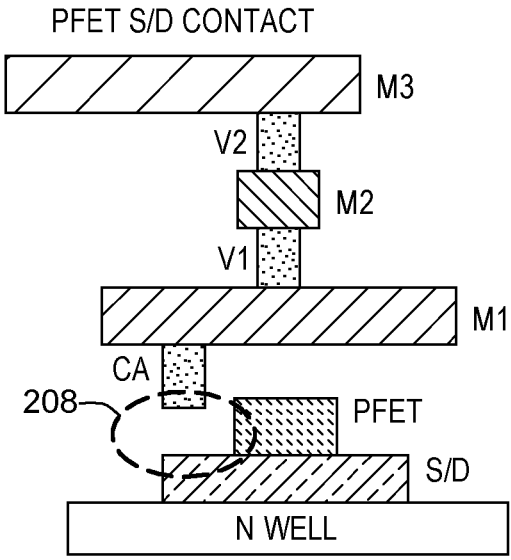

Referring to FIG. 2, the structure on the left shows a defect 202 at the via of interest (Vx). Defect 202 is shown as an open between the second metallization layer M2 and the M3 level. The structure in the middle shows a defect 205 at a prior level (Vx−1), between the M1 level and the M2 level, which is below the level of interest. The structure on the right shows a defect 208 also at a prior level. Defect 208 is an open between an integrated circuit component and the first metallization layer M1, below the level of interest. Note each of the defects 202, 205, 208 is illustrated as an open; however, the methodology for shorts is similar.

The method herein enables a way of subtracting out all prior level opens using a variation of the concept of prior level subtraction. Prior level subtraction can be used for physical defect inspection using brightfield, darkfield, and e-beam inspection tools. With this technique, current inspection results are compared to inspection results at prior levels.

Figure 3:
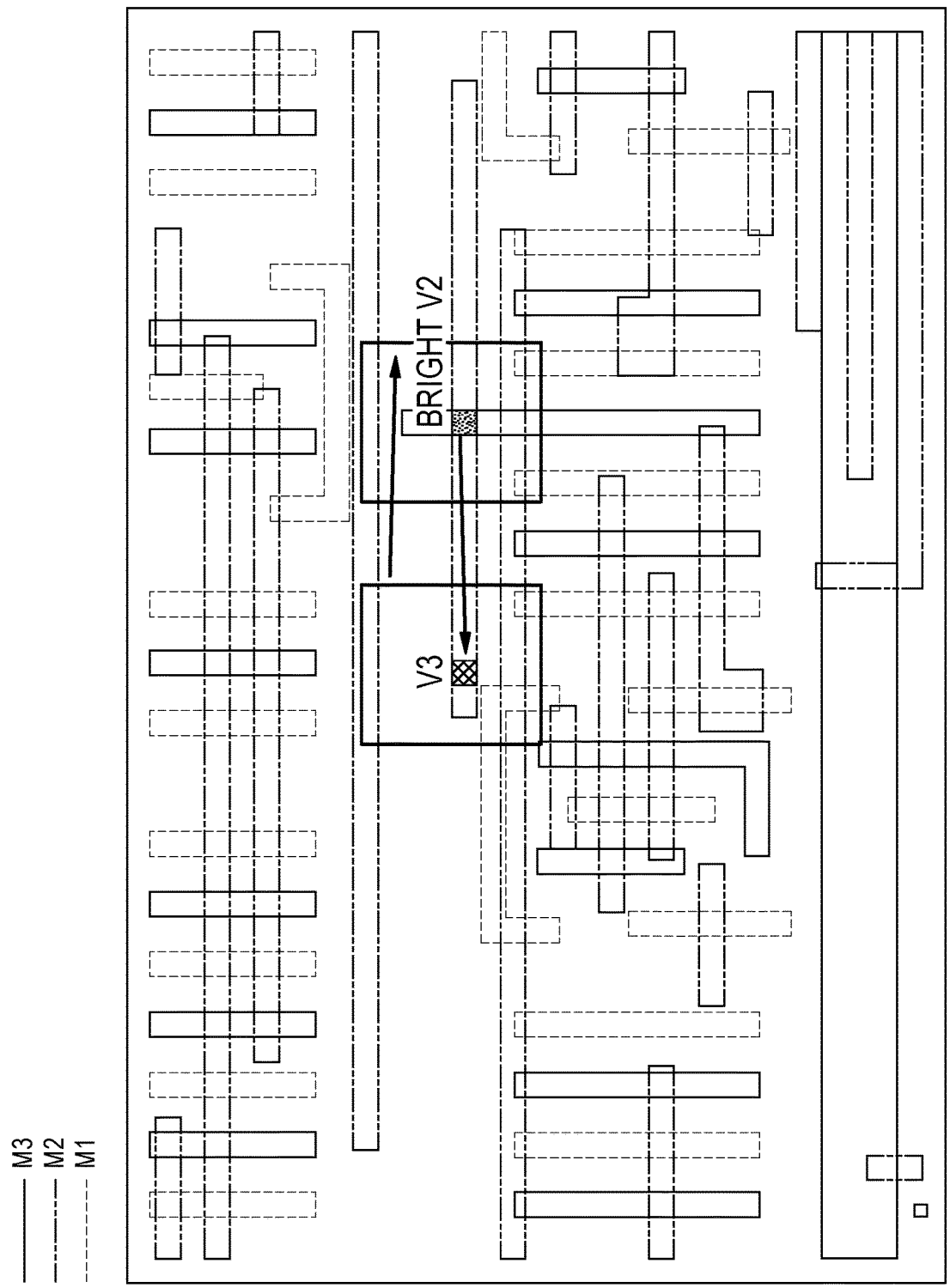
FIGS. 3 and 4 are layouts of different levels of a substrate according to structures and methods herein.
Figure 4:
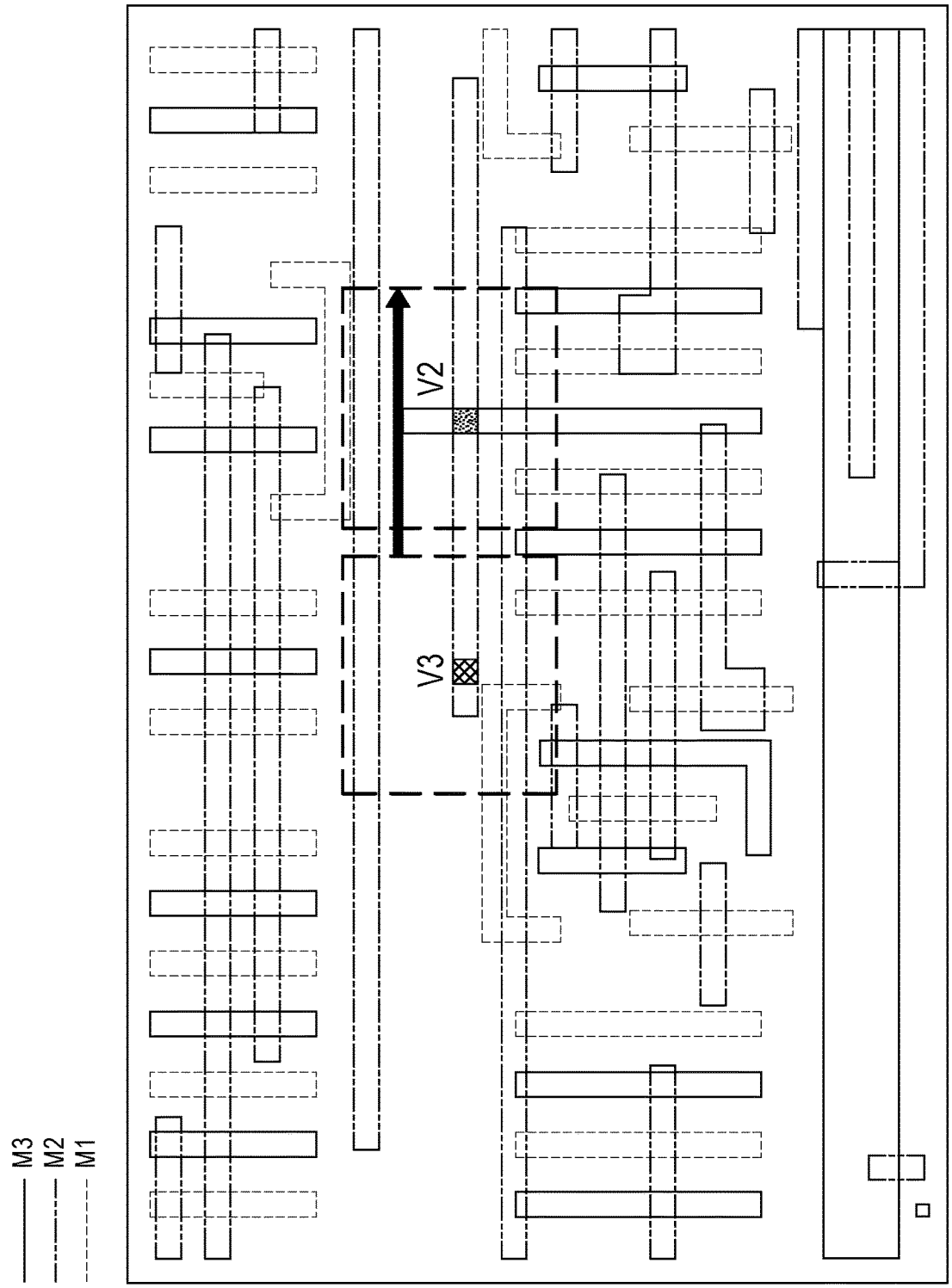

Any current level defect with the same X, Y coordinates as a defect detected at a prior level is considered a prior level defect and is subtracted from the current level inspection result. However, for voltage contrast defects prior level subtraction does not work, because the voltage contrast signal can be substantially shifted depending on the locations of the vias at the current and prior level as shown in FIG. 3. Therefore, inspection of the prior level uses translated potential defect locations (i.e., inspection locations) determined using a net trace tool. FIG. 4 illustrates a shift of a hot spot for the prior level inspection. Note the shift can be much, much larger than illustrated. Also, the hot spot field of view is generally much larger. Then, the voltage contrast defects from this prior level inspection will be translated in the opposite direction using the net trace tool for prior level subtraction.

Figure 5:
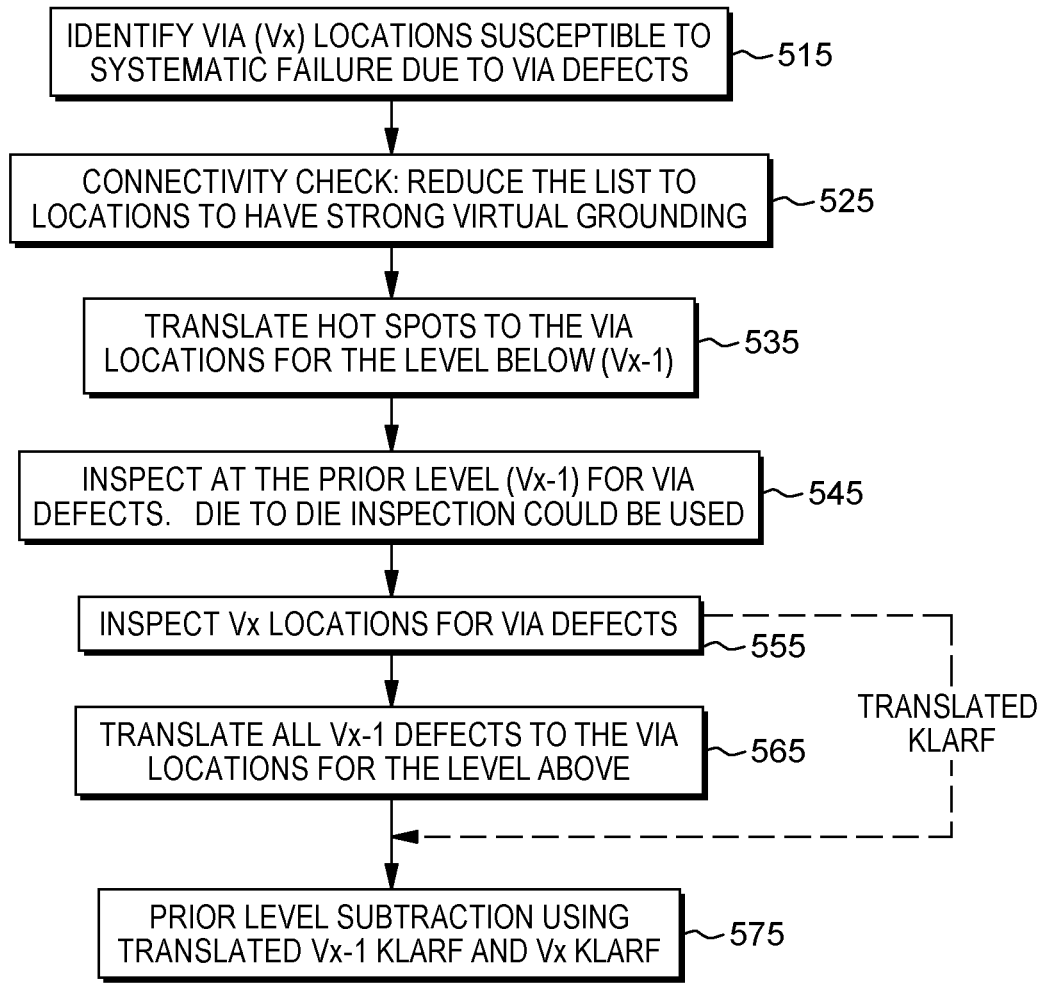
FIG. 5 is a flow diagram illustrating embodiments herein.

The methodology for using prior level subtraction to detect via opens is outlined in the block diagram in FIG. 5. First, via locations (Vx) susceptible to systematic failure due to via defects are identified, at process 515. The via defects may be via opens or via shorts. At process 525, a connectivity check is performed. This check reduces the list of via locations to via locations that will have a strong voltage contrast signal if a defect exists. For opens the via must have strong virtual grounding, as defined above. These via locations are translated to the via locations for a prior level (Vx−1), at process 535. (Note: for uni-directional patterning, only an X or Y translation is needed.) An inspection is performed at the prior level for via defects, at process 545. An appropriate inspection process, such as die-to-die inspection can be used. At process 555, the Vx via locations are inspected for defects. At process 565, the defects in the Vx−1 level are translated to the via locations for the level above. At process 575, prior level subtraction is performed using the translated defects for the Vx−1 level and the defects for the Vx level. The output of this methodology is a list of via opens attributable solely to the selected level.

In process 515, Vx locations susceptible to systematic failure may be identified by a pattern marker, which is a mark generally the size of a via indicating an electrical net. Then, at process 525, the shapes associated with pattern markers may be separated into 3 bins. The shapes associated with the markers is a top level feature: for via opens, it is the via; for via shorts, it is the top metal line.

Figure 6:
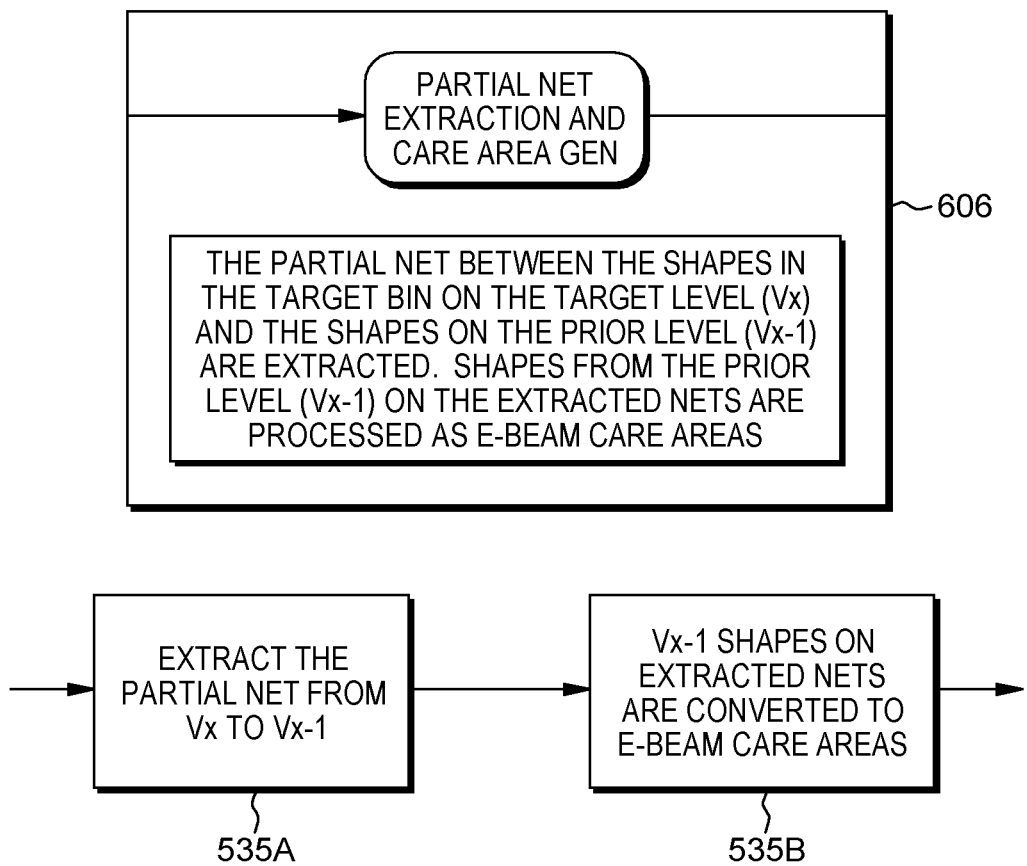
FIG. 6 is a portion of a flow diagram illustrating embodiments herein.

Process 525 produces the shapes associated with the markers for the bin of interest (generally vias connected down to the PFET fins). Referring to FIG. 6, prior level care areas are generated (block 535). A partial net is everything down to the prior inspection point. As shown in FIG. 6, the partial net between the shapes in the target bin on the target level (Vx) and the shapes on the prior level (Vx−1) are extracted. Shapes from the prior level (Vx−1) on the extracted nets are processed as e-beam care areas 606. That is, process 535 can include extracting a partial net from Vx to Vx−1 (process 535A) and converting shapes from the prior level (Vx−1) on the extracted nets to e-beam care areas (process 535B). The e-beam care areas are the potential defect locations for translation in process 565.

Figure 7:
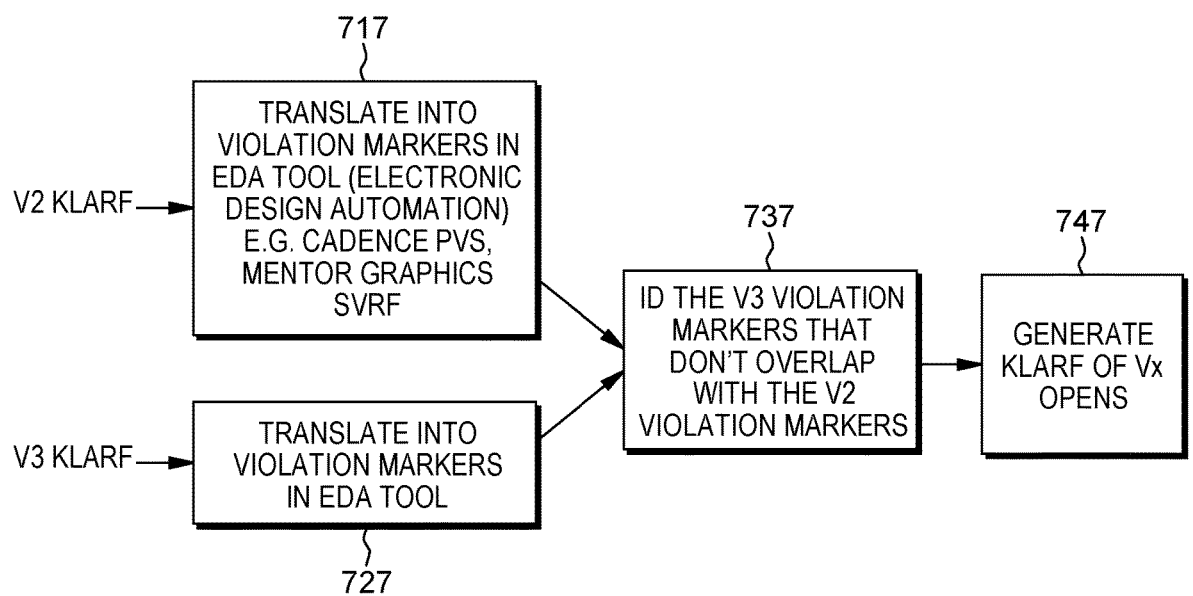
FIG. 7 is a flow diagram illustrating alternate steps of embodiments herein.

FIG. 7 illustrates an alternate workflow using an EDA (electronic design automation) tool (e.g., cadence PVS, Mentor Graphics SVRF) in which the hot spot list can be adjusted by removing patterns where opens were detected at Vx−1. This replaces process steps 565 and 575 in FIG. 5. As shown in FIG. 7, at process 717, defects in the V2 level are translated into violation markers in the EDA. Similarly, at process 727, defects in the V3 level are translated into violation markers in the EDA. At process 737, the V3 violation markers that do not overlap with the V2 violation markers are identified. At process 747, a defect list of via opens at the Vx level is generated.

Figure 8:
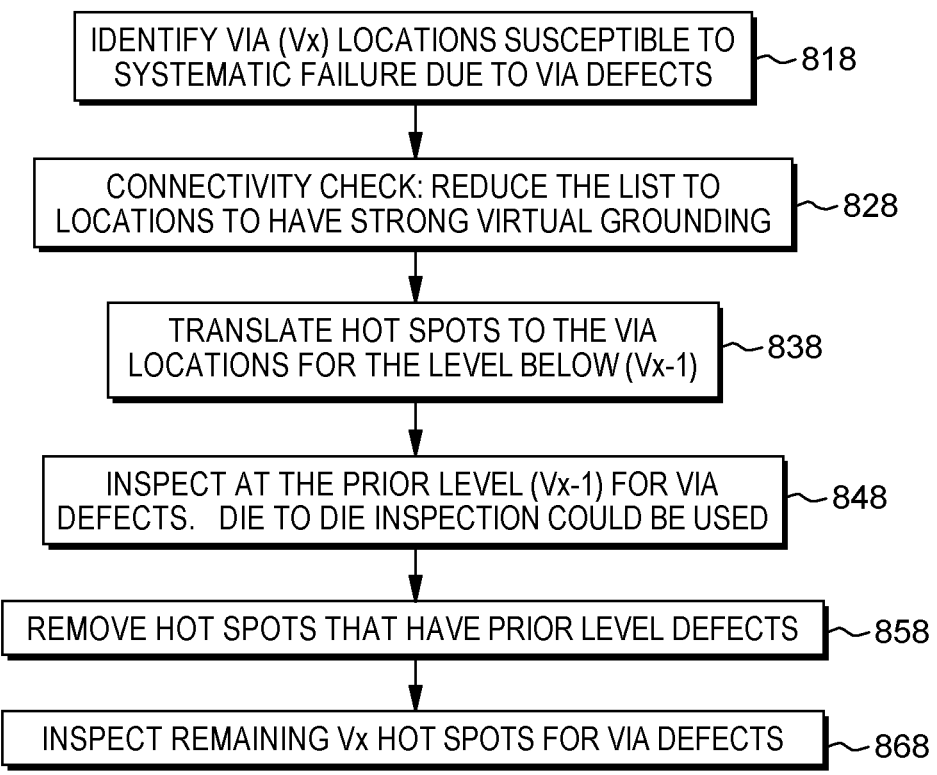
FIG. 8 is a flow diagram illustrating other embodiments herein.

FIG. 8 illustrates an alternate methodology for using prior level subtraction to detect via opens. Via locations on the selected Vx level that are susceptible to systematic failure due to via defects are identified, at process 818. The via defects may be via opens or via shorts. At process 828, a connectivity check is performed. This check reduces the list of via locations to via locations that will have a strong voltage contrast signal if a defect exists. For opens the via must have strong virtual grounding, as defined above. These via locations are translated to the via locations for a prior level (Vx−1), at process 838. An inspection is performed at the prior level for via defects, at process 848. At process 858, the via locations that have prior level defects are removed from the netlist, since they won't be able to show defects on the selected Vx level. At process 868, the remaining vias on the selected Vx level are inspected. The output of this alternate methodology is also a list of via opens attributable solely to the selected level.

Figure 9:
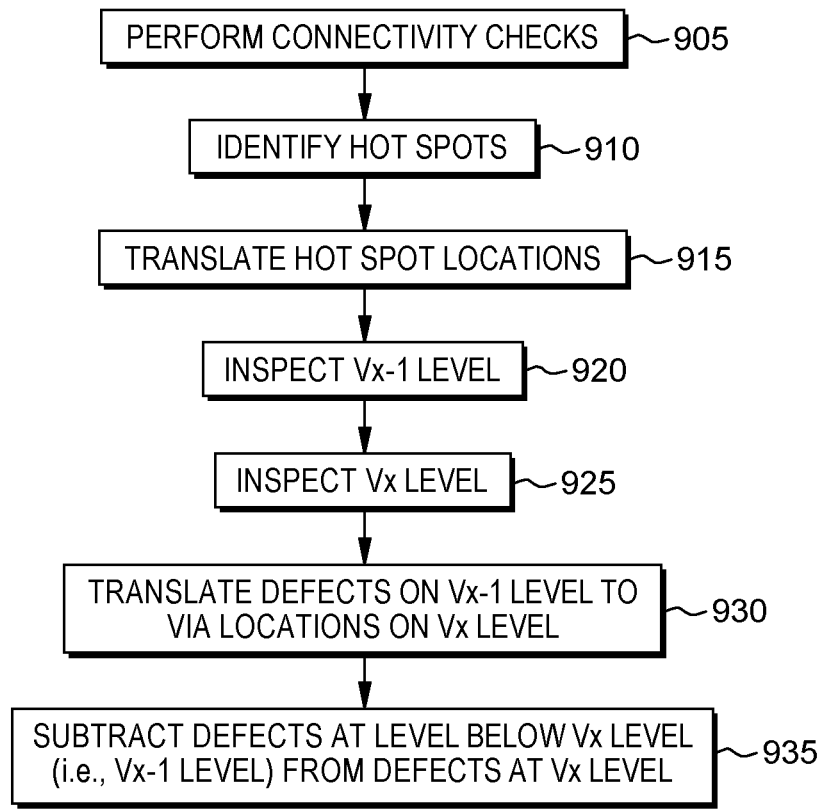
FIG. 9 is a flow diagram illustrating embodiments herein.

FIG. 9 illustrates a logic flowchart for an exemplary method in which prior level subtraction of found defects can be used to identify potential defects in locations susceptible to systematic failure due to via opens or via shorts. At 905, connectivity tests of integrated circuit structures in a die are performed. The connectivity tests are performed at a selected level (Vx) of the die. At 910, potential defect locations are identified in the die indicating via locations susceptible to systematic failure due to via opens or via shorts. At 915, the potential defect locations are translated to via locations for a prior level (Vx−1) of the die that is below the selected level. At 920, after translating the hot spot, the prior level (Vx−1) is inspected for defects. At 925, the via locations on the selected level (Vx) are inspected for defects. At 930, defects for the prior level (Vx−1) are translated to the via locations for the selected level (Vx). At 935, the translated defects for the prior level (Vx−1) are subtracted from the defects for the selected level (Vx).

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present disclosure are described herein with reference to flowchart illustrations and/or block diagrams of methods, apparatus (systems), and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It should be understood that the terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of detecting defects in levels of a die for an integrated circuit structure, the method comprising:
   identifying via locations in a selected inspection level of a die, wherein the via locations are susceptible to systematic failure due to via opens;
   performing connectivity tests of integrated circuit structures at the susceptible locations in the die using design analysis tools, the design analysis tools filtering out via locations that will not show a voltage contrast signal if a defect exists, wherein the via locations that are not filtered out are potential defect locations;
   translating the potential defect locations to matching via locations for a level below the selected inspection level;
   after translating the potential defect locations, performing a first inspection of the die at the level below the selected inspection level using a net trace tool, the first inspection identifying locations of defects in vias in levels below the selected inspection level, wherein the defects comprise via opens or via shorts;
   processing the die up to the selected inspection level;
   performing a second inspection on the via locations in the selected inspection level, the second inspection identifying locations of defects in vias in levels below the selected inspection level and in the selected inspection level;
   translating the locations of the defects from the levels below the selected inspection level to via locations for the selected inspection level using the net trace tool in the opposite direction; and
   subtracting the location of the defects found during the first inspection from the location of the defects found during the second inspection to identify locations of defects in vias in the selected inspection level.

2. The method according to claim 1, wherein performing the second inspection on the via locations in the selected inspection level further comprises performing an electron beam voltage contrast comparison inspection.

3. The method according to claim 1, wherein performing the first inspection at the level below the selected inspection level further comprises performing die-to-die inspection.

4. The method according to claim 1, wherein identifying via locations in a selected inspection level of a die, wherein the via locations are susceptible to systematic failure further comprises separating shapes associated with pattern markers into a plurality of bins.

5. The method according to claim 4, wherein the plurality of bins comprises at least three bins.

6. The method according to claim 4, wherein the pattern markers comprise a mark indicating an electrical net.

7. The method according to claim 1, wherein translating the potential defect locations uses design coordinates for the die.

8. A method comprising:
   performing connectivity tests of integrated circuit structures at a selected level of a die using design analysis tools, the design analysis tools filtering out via locations that will not show a voltage contrast signal if a defect exists;
   identifying potential defect locations in the die indicating via locations susceptible to systematic failure, the potential defect locations being via locations that are not filtered out;
   translating the potential defect locations to via locations for a prior level of the die that are on the same net as the vias at the selected level using a net trace tool, the prior level being below the selected level;
   after translating the potential defect locations, performing an electron beam voltage contrast comparison inspection for defects on each via location for the selected level of the die and the prior level of the die, the electron beam voltage contrast comparison inspection identifying locations of defects in vias;
   translating the locations of the defects for the prior level to the via locations for the selected level using the net trace tool, wherein defects for the prior level are translated in the opposite direction for the selected level; and
   subtracting the location of the translated defects for the prior level from the location of the defects for the selected level.

9. The method according to claim 8, wherein the systematic failure comprises via opens or via shorts.

10. The method according to claim 8, wherein the identifying potential defect locations in the die further comprises separating shapes associated with pattern markers into a plurality of bins.

11. The method according to claim 10, wherein the plurality of bins comprises at least three bins.

12. The method according to claim 10, wherein the pattern markers comprise a mark indicating an electrical net.

13. The method according to claim 8, wherein translating the locations of the potential defects uses design coordinates for the die.

14. A method of detecting defects in levels of a die for an integrated circuit structure, the method comprising:
    identifying potential defect locations in a selected inspection level of a die, the potential defect locations being susceptible to systematic failure;
    performing connectivity tests at the susceptible locations in the die by applying voltages to the selected level of the die;
    identifying error locations from the connectivity tests;
    translating the error locations to matching locations in a level below the selected inspection level;
    after translating the error locations, performing a first inspection at the level below the selected inspection level using a net trace tool, the first inspection identifying defects comprising via opens or via shorts;
    processing the die up to the selected inspection level;
    performing an inspection on the via locations on the selected inspection level;
    translating the defects for the level below the selected inspection level to via locations for the selected inspection level, wherein defects for the level below the selected inspection level are translated in the opposite direction using the net trace tool; and
    subtracting the defects for the level below the selected inspection level from the defects for the selected inspection level.

15. The method according to claim 14, wherein performing connectivity tests at the susceptible locations in the die comprises using design analysis tools.

16. The method according to claim 14, wherein identifying error locations from the connectivity tests further comprises performing an electron beam voltage contrast comparison inspection.

17. The method according to claim 14, wherein the identifying error locations further comprises separating shapes associated with pattern markers into a plurality of bins.

18. The method according to claim 17, wherein the plurality of bins comprises at least three bins.

19. The method according to claim 17, wherein the pattern markers comprise a mark indicating an electrical net.

20. The method according to claim 14, wherein translating the error locations uses design coordinates for the die.

\* \* \* \* \*